United States Patent [19]

Ul Haq et al.

[11] Patent Number: 4,667,311

[45] Date of Patent: May 19, 1987

[54] DYNAMIC RAM WITH REDUCED SUBSTRATE NOISE AND EQUAL ACCESS AND CYCLE TIME

[75] Inventors: Mohammed E. Ul Haq, Sunnyvale; Peter J. Bagnall, Cupertino; John A. Reed, Los Altos, all of Calif.

[73] Assignee: Visic, Inc., San Jose, Calif.

[21] Appl. No.: 704,447

[22] Filed: Feb. 20, 1985

Related U.S. Application Data

[63] Continuation-in-part of Ser. No. 699,020, Feb. 7, 1984.

[51] Int. Cl.[4] .................. G11C 11/34; G11C 7/00
[52] U.S. Cl. ........................... 365/182; 365/190
[58] Field of Search ............... 365/154, 182, 189, 190, 365/203, 205, 207, 208

[56] References Cited

U.S. PATENT DOCUMENTS 4,618,947 10/1986 Tran et al. ..................... 365/230

*Primary Examiner*—Terrell W. Fears
*Assistant Examiner*—Melissa J. Koval
*Attorney, Agent, or Firm*—Flehr, Hohbach, Test, Albritton & Herbert

[57] ABSTRACT

There is described a CMOS random access memory having memory access circuitry which substantially eliminates substrate noise caused by capacitive coupling of the bit lines to the substrate, and which allows the memory to have equal length access and cycle times. Access circuitry for each column of cells includes a pair of differential bit lines, at least one bit line equalization transistor, and a CMOS sense amp. The sense amp has two p-channel pull-up transistors, each having its source node connected to a common pull-up node, and two n-channel pull-down transistors, each having its source node connected to a common pull-down node.

At the beginning of each memory access cycle the differential bit lines are equalized and the common pull-up and pull-down nodes are equalized. Then, substantially simultaneously, the common pull-up node is charged while the common pull-down node is discharged. By making the bit line charging and discharging activities simultaneous, the substrate noise normally generated by bit line to substrate capacitive coupling is virtually eliminated. Furthermore, since bit line precharge is performed at the beginning of each access cycle, rather than between access cycles, the access and cycle times of the memory are equal.

8 Claims, 12 Drawing Figures

FIG.-5 ROW ADDRESS BUFFER

FIG.-6 ROW PREDECODER

PEQ AND NEQ CLOCKS

FIG.—8

RDE CLOCK

DYNAMIC RAM WITH REDUCED SUBSTRATE NOISE AND EQUAL ACCESS AND CYCLE TIME

This is a continuation-in-part of U.S. patent application Ser. No. 699020, filed Feb 7, 1984, entitled Memory With Improved Column Access, in the name of Mohammed Ejaz Ul Haq and Peter John Bagnall, which is hereby incorporated by reference. Both applications are assigned to the same assignee, VISIC, Inc.

The present invention relates generally to an improved dynamic random access memory, and particularly to a dynamic memory having a precharge period which is part of its access cycle, thereby making the memory's cycle time equal to its access time, and having an improved sensing method which both reduces access time and reduces substrate noise.

BACKGROUND OF THE INVENTION

A problem commonly associated with MOS and CMOS ramdom access memories (herein called RAMs) is substrate noise caused by capacitive coupling of the RAM's bit lines with the substrate (or the p- or n- well in the case of CMOS RAMs) during the sensing cycle. This substrate noise problem is often compensated for in prior art devices by slowing down the sensing cycle. In the present invention this problem is totally eliminated by a design which results in balanced, and thus self-cancelling, capacitive coupling of the bit lines to the substrate.

The prior art also includes a growing number of CMOS pseudostatic dynamic RAMs which are designed to mimic some of the operating characteristics of static RAMs.

As is well known, conventional dynamic RAMs are less convenient to use than static RAMs because: (1) special care must be taken by the user to ensure that all the cells of the dynamic RAM are refreshed periodically; and (2) dynamic RAMs typically have complicated timing requirements whereas static RAMs typically are relatively simple to use. A number of prior art devices have includes auto refresh circuitry which makes the device self refreshing. The present invention greatly simplifies the timing requirements for using a dynamic RAM and thus addresses the other one of the two major difficulties associated with the use of dynamic memories. In particular, the present invention provides a dynamic memory wherein bit line precharge is performed at the beginning of each access cycle, rather than between access cycles. Therefore the access and cycle times of the memory are equal, and the user of the memory need not provide for a precharge period between memory access cycles.

The combination of the precharge and sensing features of the present invention enables the construction of CMOS dynamic RAMs which are faster and easier to use than the prior art devices known to the inventors.

It is therefore a primary object of the present invention to provide an improved dynamic random access memory.

Another object of the present invention is to provide a CMOS dynamic RAM which uses balanced bit line sensing to substantially eliminate substrate noise during the sensing cycle.

Still another object of the present invention is to provide a CMOS dynamic RAM with equal access and cycle time.

SUMMARY OF THE INVENTION

In summary, the present invention is a CMOS random access memory having memory access circuitry which substantially eliminates substrate noise caused by capacitive coupling of the bit lines to the substrate, and which allows the memory to have equal length access and cycle times. Access circuitry for each column of cells includes a pair of differential bit lines, at least one bit line equalization transistor, and a CMOS sense amp. The sense amp has two p-channel pull-up transistors, each having its source node connected to a common pull-up node, and two n-channel pull-down transistors, each having its source node connected to a common pull-down node.

At the beginning of each memory access cycle the differential bit lines are equalized and the common pull-up and pull-down nodes are equalized. Then, substantially simultaneously, the common pull-up node is charged while the common pull-down node is discharged. By making the bit line charging and discharging activities simultaneous, the substrate noise normally generated by bit line to substrate capacitive coupling is virtually eliminated. Furthermore, since bit line precharge is performed at the beginning of each access cycle, rather than between access cycles, the access and cycle times of the memory are equal.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
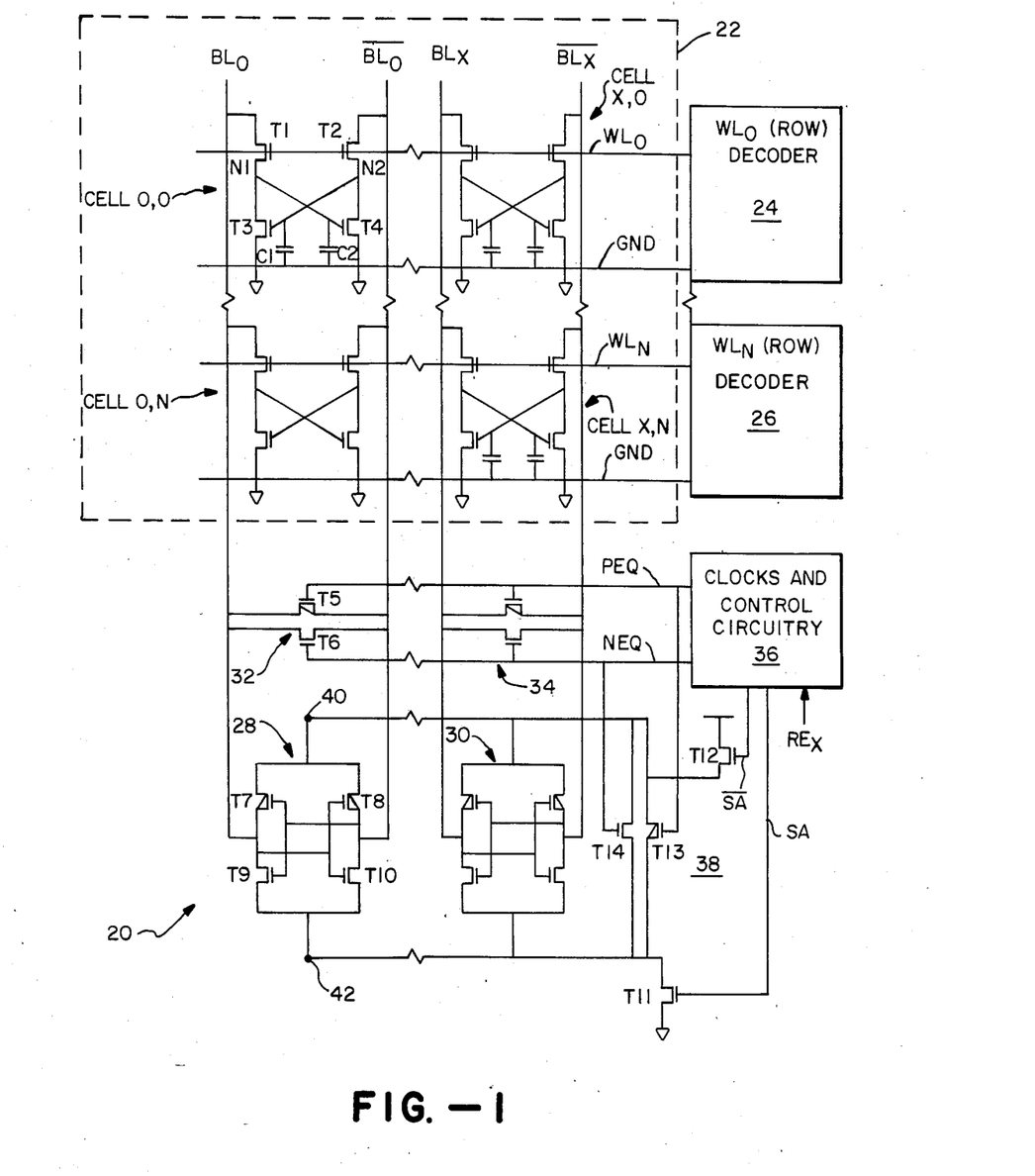
FIG. 1 is a circuit diagram of a memory array, sense amp circuit and bit line equalization circuit in accordance with the present invention.

Referring to FIG. 1, there is shown a CMOS memory device 20 including a memory array 22, row decoders 24 and 26, sense amps 28 and 30, equalization circuits 32 and 34, and control circuitry 36 and 38.

The memory array 22 is arranged in rows and columns. Each row, such as the top row in FIG. 1, has a corresponding word line $WL_0$, and a set of memory cells Cell 0,0 to Cell X,0. Each column, such as the leftmost column in FIG. 1, has a corresponding pair of differential bit lines $BL_0$ and $\overline{BL_0}$, and a set of memory cells Cell 0,0 to Cell 0,N which can be connected to those bit lines. During each memory access cycle, one cell is connected to each pair of differential bit lines in accordance with the currently selected word line (i.e., one of the word lines $WL_0$ to $WL_N$, which is selected in accordance with the address signals received by the memory 20).

In the preferred embodiment, each cell is a four transistor cell. Referring to Cell 0,0 in FIG. 1, nodes N1 and N2 are the storage nodes of the memory cell. These two storage nodes N1 and N2 are connected to differential bit lines $BL_0$ and $\overline{BL_0}$ by access transistors T1 and T2 when the work line $WL_0$ for the cell is activated. Then the difference in voltage (or, equivalently, the charge stored) on the two storage nodes N1 and N2 is sensed and amplified by the sense amp 28 at the end of the pair of differential bit lines $BL_0$ and $\overline{BL_0}$.

At the end of each pair of differential bit lines, such as bit lines $BL_0$ and $\overline{BL_0}$, there is a pair of equalization transistors T5 and T6, and a sense amp 28. When the equalization transistors are activated, the voltage levels on each pair of bit lines to equalized, generally at a level approximately equal to $\frac{1}{2}VDD$ (i.e., one half the supply voltage level). Transistor T5, which is a p-channel transistor is activated by the PEQ signal; transistor T6, which is an n-channel transistor is activated by the NEQ signal.

The sense amp 28 is a CMOS sense amp with two p-channel pull-up transistors T7 and T8, and two n-channels pull-down transistors T9 and T10. Each p-channel transistor has its source node connected to a common pull-up node 40, its gate node connected to a corresponding one of the pair of differential bit lines, and its drain connected to the other one of the pair of differential bit lines. Each n-channel transistor has its source node connected to a common pull-down node 42, its gate node connected to a corresponding one of the pair of differential bit lines, and its drain connected to the other one of the bit lines.

The sense amps 28 and 30 are activated by the SA and $\overline{SA}$ clock signals during the sensing portion of each memory access cycle. The SA clock signal activates pull-down transistor T11, which discharges common pull-down node 42; the $\overline{SA}$ clock signal activates pull-up transistor T12, which charges common pull-up node 40.

During the precharge portion of each memory cycle the PEQ and NEQ signals are activated (while the SA and $\overline{SA}$ clock signals are inactive), thereby activating p-channel equalization transistor T13 and n-channel equalization transistor T14. This causes the voltage levels on the common pull-up and pull-down nodes 40 and 42 to be equalized, generally at a level approximately equal to $\frac{1}{2}VDD$.

One feature of the present invention is an improved equalization circuit and method that reduces hot carrier injection by the n-channel equalization transistors T6 and T14. In particular, the PEQ signal is activated shortly (approximately one inverter delay) before the NEQ signal. As a result, the p-channel transistor T13 begins conducting current before the n-channel transistor T14 is activated. Therefore the voltage differentials between the bit lines, and the sense amp common nodes 40 and 42, are reduced before the n-channel transistors T6 and T14 are activated, thereby reducing the incidence of hot carrier injection by the n-channel equalization transistors T6 and T14. Furthermore, it is desirable to use both an n-channel transistor and a p-channel transistor for equalization, rather than using just a p-channel transistor, because the n-channel device is stronger than the p-channel device for a given device size.

The clock and control circuitry 36 generates the NEQ, PEQ, SA, $\overline{SA}$, and other control signals needed to operate the memory 20. This circuitry 36, at least insofar as is relevant to the present invention, is generally responsive to a single external clock signal, REx. Upon the occurrence of an upward transition of the REx signal, the memory 20 latches in the address signals (not shown) presented by the user to the memory and generates the clock and control signals needed to provide access to the addressed cell in the memory array 22. The portions of the circuitry 36 which are relevant to the present invention are described below.

In the preferred embodiment, the memory 20 is formed on an N-substrate and the memory array 22 is formed in a p-well. The N- substrate is connected to the memory's power supply VDD (which is typically 5 volts DC); the p-well is grounded. Thus no back bias generator is used in the preferred embodiment.

Figure 2:
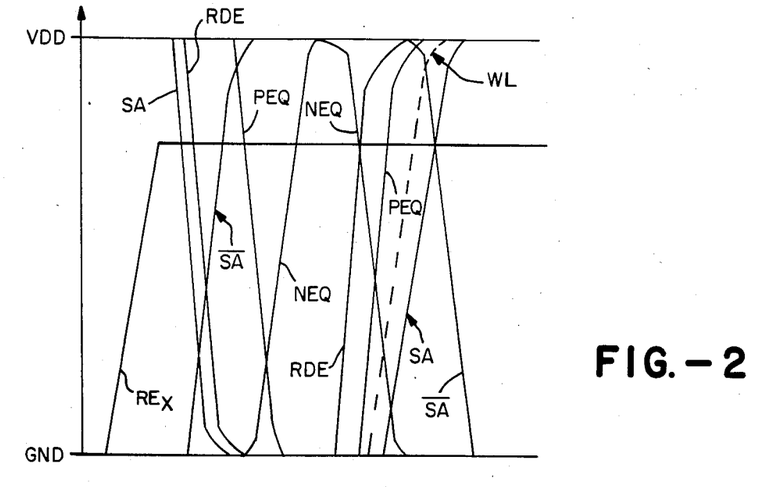
FIGS. 2 and 3 are timing diagrams of the operation of the present invention.

Referring to FIG. 2 there is shown a general timing diagram of the major signals used in the preferred embodiment. After the occurrence of an external REx signal the precharge portion of the access cycle begins. As will be described in more detail below, the row decoder driver signal, RDE (which stands for Row Decoder Enable), and the sense amp driver signals SA and $\overline{SA}$ are deactivated. This de-energizes the memory's word lines $WL_0$ to $WL_N$ (thereby disconnecting all memory cells from the bit lines) and electrically isolates the common sense amp pull-up and pull-down nodes 40 and 42.

Next the equalization clock signals PEQ and NEQ are activated (in that order, as discussed above), which causes each pair of differential bit lines BL and $\overline{BL}$ to be equalized and also causes the common pull-up and pull-down nodes 40 and 42 to be equalized. Since, by its very nature, this equalization process causes equal upwards and downwards voltage transitions on each pair of bit lines, there is substantially not net capacitive coupling of the bit lines to the substrate.

At this point in the cycle the "precharge" portion of the cycle is complete and the sensing portion of the cycle begins.

The first step of the sensing portion of the cycle is to activate the RDE signal which is the driver signal for the row decoders 24 to 26. Note that, as will be understood by those skilled in the art, during the precharge portion of the cycle, the row address lines have been read in and predecoded so that when the RDE signal becomes active, the predecoded inputs to the row decoders will be ready.

The activation of the RDE signal deactivates the equalization clock signals NEQ and PEQ and causes the selected word line WL to become active. Shortly after the selected word line becomes active both of the sense amp clock signals SA and $\overline{SA}$ are substantially simultaneously activated. The differential signals on each pair of differential bit lines are amplified by the sense amps. Furthermore, because the two sense amp clock signals are substantially simultaneous, the upward and downward voltage transitions on each pair of differential bit lines is substantially balanced and thus there is substantially no net capacitive coupling of the bit lines to the substrate.

Figure 3:
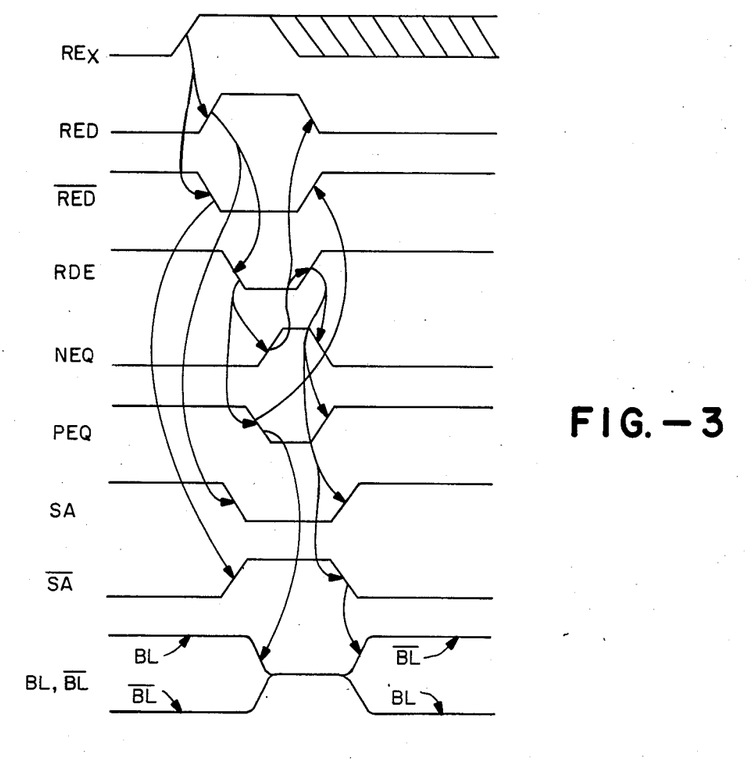

Referring to FIG. 3, there is shown a more detailed timing diagram which will be referred to in conjunction with the circuit diagrams fo FIGS. 4 through 9.

Figure 4A:
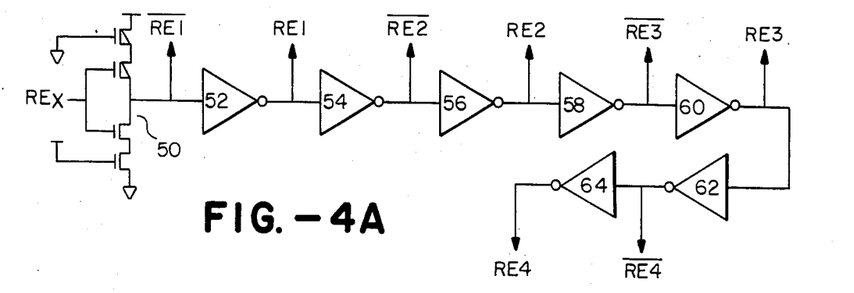
FIGS. 4A through 4D are circuit diagrams of the RE1 through RE4, and RED clock circuits.

Referring to FIG. 4A, the external clock signal REx is connected to a chain of CMOS inverters 50 through 64. These inverters generate a chain of clock signals, RE1 and $\overline{RE1}$ through RE4 and $\overline{RE4}$, which are used to read in and predecode the row address signals presented to the memory device 20.

Figure 4B:
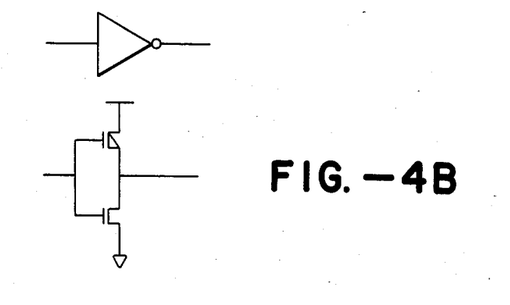

Referring to FIG. 4B, the symbol and circuit equivalent for a CMOS inverter is shown.

Figure 5:
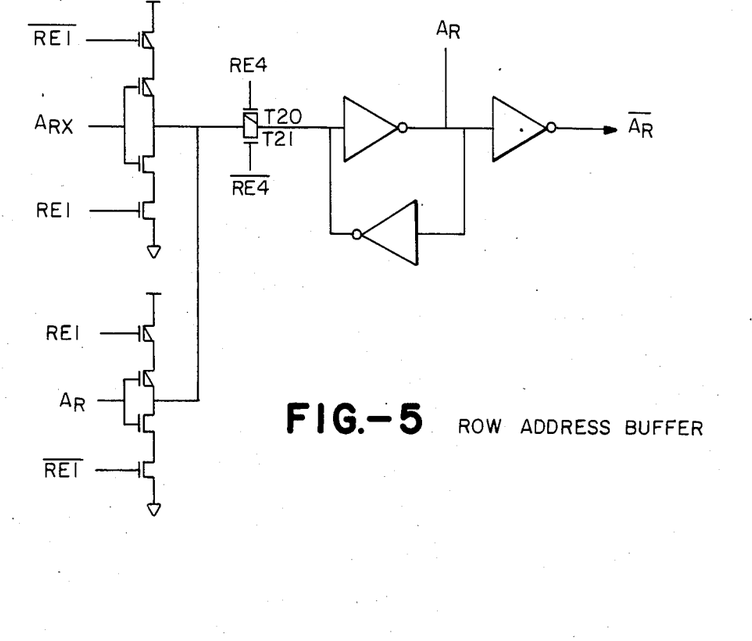
FIG. 5 is a circuit diagram of a row address buffer.

Referring to FIG. 5, there is shown a circuit diagram of a row address buffer. The input row address signal is labelled $A_{RX}$ and the buffered address signals are labelled $A_R$ and $\overline{A_R}$. In the preferred embodiment, the reading of the row address signals is enabled by the RE1 and $\overline{RE1}$ signals. The sampling of the input row address signal $A_{RX}$ is terminated by the RE4 and $\overline{RE4}$ signals. That is, the transfer devices T20 and T21 are deactivated when the RE4 and $\overline{RE4}$ signals become active (typically 5 nanoseconds after REx triggers the beginning of an access cycle).

Referring to FIGS. 3, 4A, and 5, it can be seen that after the row address signals have been latched in, the REx signal can be deactivated at any time without disturbing the memory access cycle. In the preferred embodiment, the REx signal is typically specified as having a minimum active hold period of 10 nanoseconds.

Figure 6:
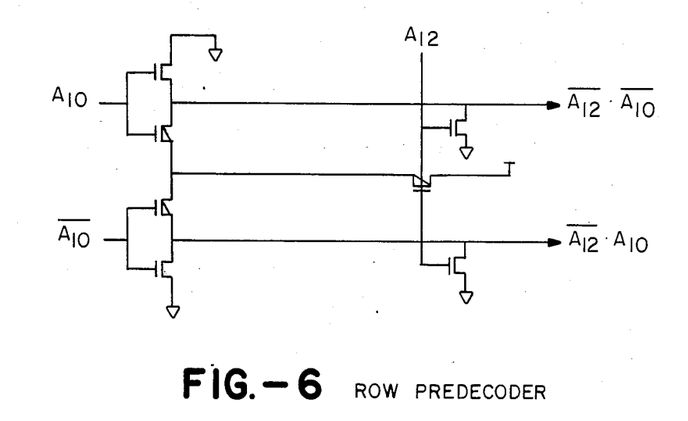
FIG. 6 is a circuit diagram of a row address predecoder.

Referring to FIG. 6, there is shown an example of a row address predecoder. Row address signals $A_{10}$ and $A_{12}$ are combined to generate predecoded row address signals $\overline{A_{12}A_{10}}$ and $\overline{A_{12}}A_{10}$.

Figure 4C:
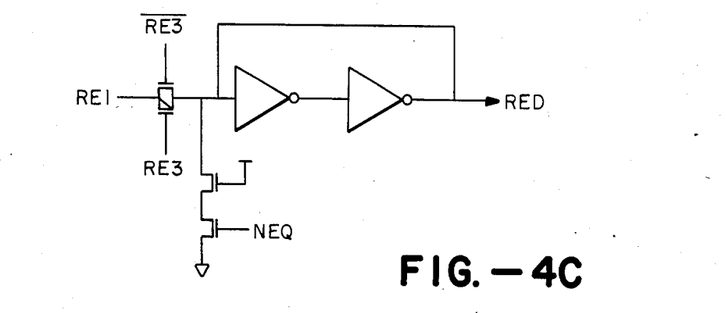
Figure 4D:
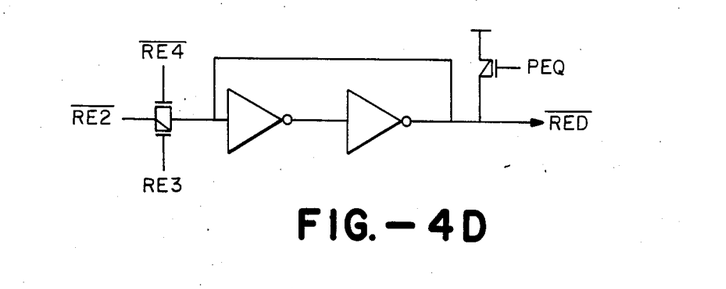

Referring to FIGS. 4C and 4D, there are shown the circuits for generating intermediate row decoder signals RED and $\overline{RED}$. As can be seen from the circuit diagrams, and as shown in FIG. 3, the RED and $\overline{RED}$ signals are activated substantially simultaneously, four to five inverter delays after REx triggers the beginning of an access cycle. The RED and $\overline{RED}$ signals are reset by the NEQ and PEQ signals, respectively.

Figure 7:
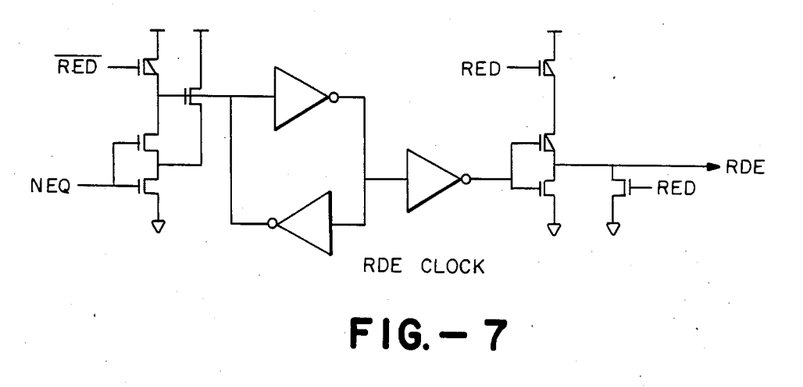
FIG. 7 is a circuit diagram of the RDE clock circuit.

Referring to FIG. 7, the row decoder enable signal, RDE, is deactivated when the RED signal is activated. As will be explained in more detail with reference to FIG. 9, all word line WL signals are deactivated when RDE is deactivated. This disconnects all memory cells from the bit lines in preparation for the "precharging" (i.e., equalization of the bit lines).

The RDE signal is reenabled by the NEQ equalization signal, after several inverter delays.

Figure 8:
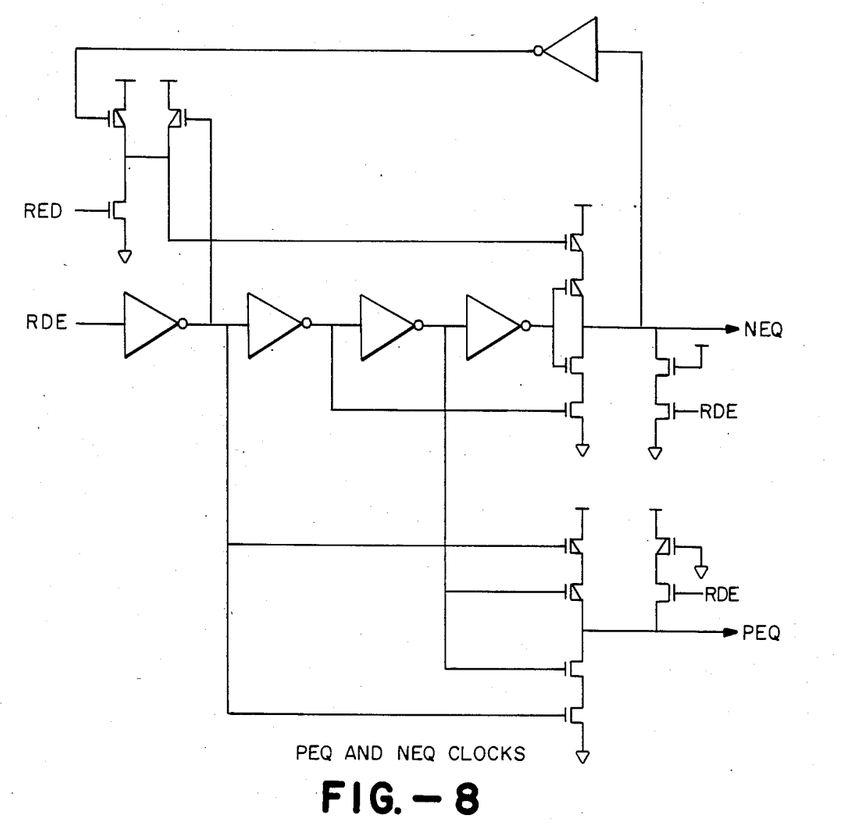
FIG. 8 is a circuit diagram of the NEQ and PEQ clock circuit.

Referring to FIG. 8, the PEQ and NEQ equalization signals are both activated by the falling edge of the RDE signal, with the PEQ signal being activated approximately one inverter delay before the NEQ signal. Furthermore the PEQ and NEQ signals are reset when the RDE signal is activated. As discussed above, the activation of the PEQ signal before the NEQ signal reduces the incidence of hot carrier injection by the n-channel equalization transistors used in the memory.

Referring to FIGS. 3, 7 and 8, it can be seen that the RDE, PEQ and NEQ are interlocking signals. The precharge sequence which these signals control is started by the activation of the RED and $\overline{RED}$ signals. This deactivates the row decoder enable RDE signal, which activates the PEQ and NEQ equalization signals. The NEQ signal, in turn, reactivates the RDE signal, which then deactivates both the PEQ and NEQ signals.

It is preferred that the NEQ signal be delayed by one to three inverter delays from the PEQ signal and, in general, the NEQ signal should not be delayed by more than one half or, at most, three fourths of the width of the PEQ clock cycle.

Figure 9:
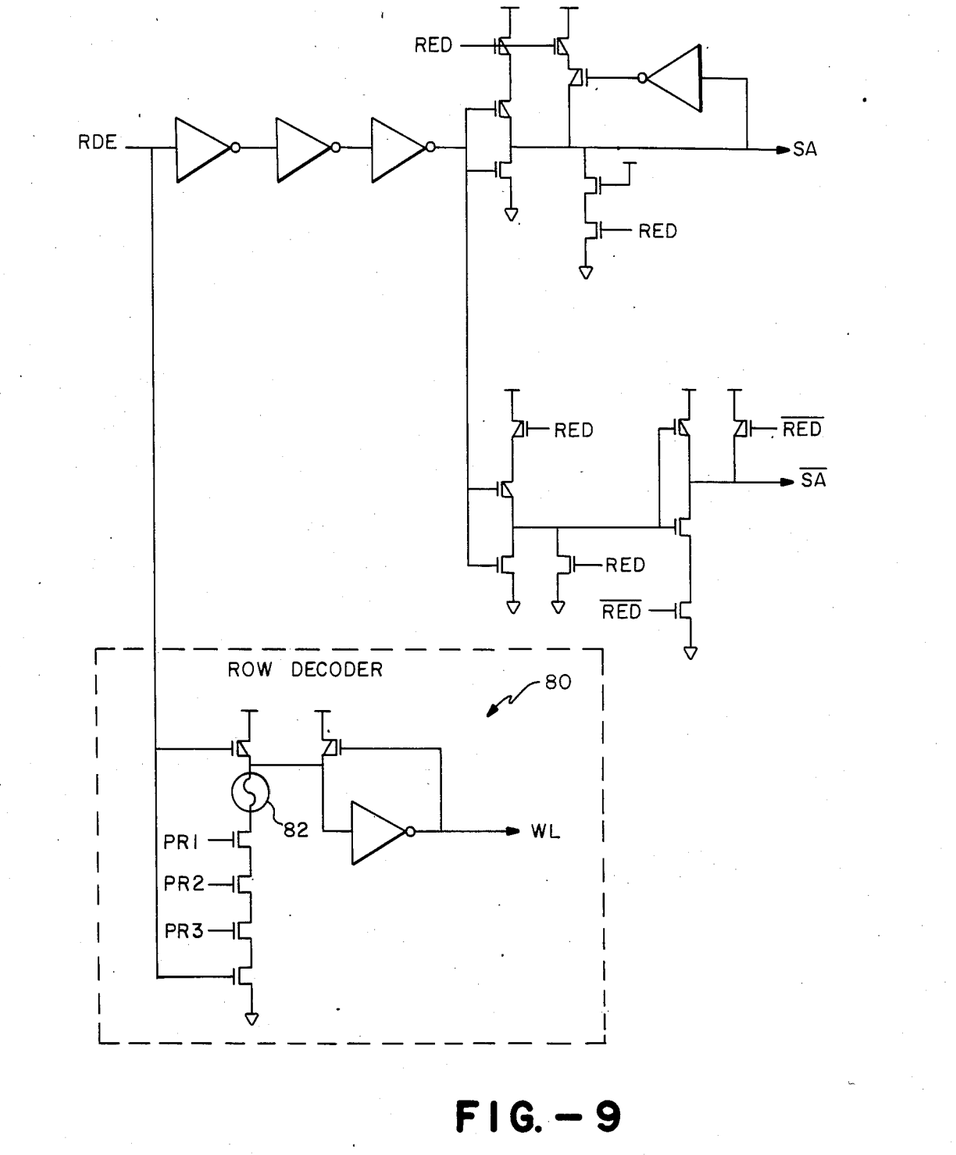
FIG. 9 is a circuit diagram of the sense amp clock circuit.

Referring to FIG. 9, there is shown a preferred embodiment of the sense amp clock generator and a row decoder. As can be seen from the circuit diagram, the SA and $\overline{SA}$ clock signals are generated substantially simultaneously, several inverter delays after the RDE signal is enabled.

The sensing clock signals, SA and $\overline{SA}$ are normally active except during the precharge portion of each memory access cycle. Accordingly, the SA and $\overline{SA}$ signals are deactivated early in the precharge sequence by the intermediate row decoder signals RED and $\overline{RED}$, and are reactivated shortly after the row decoders are reactivated.

Referring to the row decoder circuit 80 shown in FIG. 9, as will be understood by those skilled in the art, there will be one such row decoder for each row of memory cells in the memory array 22. While RDE is inactive, all of the word line signals WL are grounded (i.e., inactive). When RDE becomes active, the predecoded row address signals determine which one of the word line signals WL will be activated. As is now common practice, a fuse 82 is included in each row decoder so that rows with defective cells can be effectively cut out of the memory. The circuitry for patching in a redundant row of memory cells is not shown because it is well known to those skilled in the art, and is not relevant to the present invention.

Still referring to FIG. 9, and also referring to FIG. 2, it can be seen that the sensing signals SA and $\overline{SA}$ are sufficiently delayed from the RDE signal that the selected word line WL will be activated before the sense amps are activated. Thus the selected row of cells will be connected to their respective bit lines shortly before the sense amps are activated.

Referring to the timing diagram in FIG. 3, there is shown a typical waveform for a pair of differential bit lines BL and $\overline{BL}$.

In view of the above description it can be seen that capacitive coupling of the bit lines to the substrate is substantially eliminated by the present invention. In particular, both during equalization and during sensing, the bit lines in each pair of differential bit lines undergo substantially equal and opposite voltage transitions and therefore the net capacitive coupling to the substrate is substantially eliminated.

Furthermore use of the dynamic memory of the present invention is simplified by virtue of the fact that the precharge cycle is part of the memory access cycle, and therefore the access and cycle times of the memory are equal (as is standard in static memory devices).

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

For instance, alternate embodiments of the invention could use a single equalization transistor in each of the places that two complementary transistors are used in the preferred embodiment.

What is claimed is:

1. In a CMOS random access memory having an array of cells arranged in rows and columns, memory access circuitry comprising:
   bit line equalization clock means for generating an equalization clock signal;
   sense amp clock means for generating substantially simultaneous first and second sensing clock signals;
   a sense amp pull-up node and a sense amp pull-down node;
   sense amp pull-up means responsive to said first sensing clock signal for charging said sense amp pull-up node;

sense amp pull-down means responsive to said second sensing clock signal for discharging said sense amp pull-down node;

common node equalization means responsive to said bit line equalization means for interconnecting said sense amp pull-up and pull-down nodes;

access circuitry for each of a multiplicity of said columns of cells comprising:
a pair of differential bit lines;
equalization means responsive to said equalization signal for interconnecting said pair of differential bit lines; and
a sense amp including
two p-channel pull-up transistors, each having its source node connected to said sense amp pull-up node, its gate node connected to a corresponding one of said pair of differential bit lines, and its drain connected to other one of said pair of differential bit lines; and
two n-channel pull-down transistors, each having its source node connected to said send amp pull-down node, its gate node connected to a corresponding one of said pair of differential bit lines, and its drain connected to other one of said pair of differential bit lines; and timing control means responsive to an externally generated signal for disabling said sense amp clock means, then temporarily activating said bit line clock equalization means, and then reactivating said sense amp clock means.

2. Memory access circuitry as set forth in claim 1, wherein
said bit line equalization clock means generates a first equalization clock signal and a second equalization clock signal which is delayed from said first equalization clock signal; and
said equalization means in the access circuitry for each said column of cells includes a p-channel transistor and an n-channel transistor, said p-channel transistor being responsive to said first equalization clock signal, and said n-channel transistor being responsive to said second equalization clock signal.

3. In a CMOS random access memory having an array of cells arranged in rows and columns, memory access circuitry comprising:
access circuitry for each of a multiplicity of said columns of cells comprising:
a pair of differential bit lines;
bit line equalization means for controllably interconnecting said pair of differential bit lines; and
a sense amp including
two p-channel pull-up transistors, each having its source node connected to a common pull-up node, its gate node connected to a corresponding one of said pair of differential bit lines, and its drain connected to other one of said pair of differential bit lines; and
two n-channel pull-down transistors, each having its source node connected to common pull-down node, its gate node connected to a corresponding one of said pair of differential bit lines, and its drain connected to other one of said pair of differential bit lines;
common node equalization means for controllably interconnecting said common pull-up and pull-down nodes;
control means responsive to an externally generated signal for temporarily activating said bit line equalization means and said common node equalization means, and then for substantially simultaneously charging said common pull-up node and discharging said common pull-down node.

4. Memory access circuitry as set forth in claim 3, wherein
said bit line equalization means in the access circuitry for each said column of cells includes a p-channel transistor and an n-channel transistor; and
said control means includes means for activating said p-channel transistor in said bit line equalization means before activating said n-channel transistor in said bit line equalization means.

5. In a CMOS random access memory, formed in a semiconductor substrate and having an array of cells arranged in rows and columns, memory access circuitry comprising:
access circuitry for each of a multiplicity of said columns of cells comprising:
a pair of differential bit lines;
bit line equalization means for controllably interconnecting said pair of differential bit lines; and
a CMOS sense amp; and
control means responsive to an externally generated signal for temporarily activating said bit line equalization means, and then for activating said CMOS sense amp so that it substantially simultaneously charges one of said pair of differential bit lines and discharges the other of said pair of differential bit lines;
whereby the capacitive coupling of each said bit line to the substrate is substantially counterbalanced by the capacitive coupling of other bit line from the same pair of differential bit lines.

6. Memory access circuitry as set forth in claim 5, wherein
said bit line equalization means in the access circuitry for each said column of cells includes a p-channel transistor and an n-channel transistor; and
said control means includes means for activating said p-channel transistor in said bit line equalization means before activating said n-channel transistor in said bit line equalization means.

7. In a method of accessing data stored in a CMOS random access memory,
wherein said memory is formed in a semiconductor substrate, has an array of cells arranged in rows and columns, and each of a multiplicity of said columns of cells has a pair of differential bit lines terminated by a CMOS sense amp;
the steps of responding to an externally generated signal indicative of the beginning of a memory access cycle by:
temporarily disconnecting all cells from said bit lines;
equalizing the charge stored on each said pair of differential bit lines;
connecting a selected cell to each of said pairs of differential bit lines; and then
activating each said CMOS sense amp so that it substantially simultaneously charges one of said pair of differential bit lines and discharges the other of said pair of differential bit lines;
whereby the capacitive coupling of each said bit line to the substrate is substantially counterbalanced by the capacitive coupling of the other bit line from the same pair of differential bit lines.

8. In a CMOS random access memory, formed in a semiconductor substrate and having an array of cells arranged in rows and columns, memory access circuitry comprising:

access circuitry for each of a multiplicity of said columns of cells comprising:

a pair of differential bit lines;

bit line equalization means for controllably interconnecting said pair of differential bit lines, including a p-channel transistor and an n-channel transistor; and a sense amp for controllably amplifying a differential signal on said pair of differential bit lines; and control means responsive to an externally generated signal for temporarily activating said bit line equalization means, including means for activating said p-channel transistor in said bit line equalization means before activating said n-channel transistor in said bit line equalization means.

* * * * *